United States Patent [19]

Kotachi et al.

[11] Patent Number: 5,153,103

[45] Date of Patent: Oct. 6, 1992

[54] RESIST COMPOSITION AND PATTERN FORMATION PROCESS

[75] Inventors: Akiko Kotachi, Yokohama; Satoshi Takechi, Machida, both of Japan

[73] Assignee: Fujitsu Limited, Kawasaki, Japan

[21] Appl. No.: 667,897

[22] Filed: Mar. 12, 1991

[30] Foreign Application Priority Data

Mar. 13, 1990 [JP] Japan .................................. 2-061552

[51] Int. Cl.$^5$ ............................ G03F 7/38; G03F 7/30
[52] U.S. Cl. ..................................... 430/296; 430/330;
430/327; 430/326; 430/967; 430/317; 430/313;
430/323
[58] Field of Search ............... 430/296, 330, 327, 326, 430/967, 317, 313, 323

[56] References Cited

U.S. PATENT DOCUMENTS

| | | | |
|---|---|---|---|
| 4,061,832 | 12/1977 | Roberts | 430/296 X |
| 4,268,590 | 5/1981 | Eranian et al. | 430/296 X |
| 4,415,653 | 11/1983 | Lai et al. | 430/296 |
| 4,686,168 | 8/1987 | Fujii et al. | 430/296 X |
| 4,701,342 | 10/1987 | Novembre et al. | 430/296 X |

FOREIGN PATENT DOCUMENTS

| | | |
|---|---|---|
| 0236914 | 9/1987 | European Pat. Off. |
| 0379173 | 7/1990 | European Pat. Off. |
| 60-252348 | 12/1985 | Japan ............ 430/296 |
| 62-79445 | 4/1987 | Japan ............ 430/296 |

OTHER PUBLICATIONS

L. F. Thompson et al. "Resist Processing" in *Introduction to Microlithography: Theory, Materials and Processing*, L. F. Thompson et al. eds., American Chemical Society, Washington, D.C. 1983, ACS Symposium Series 219, pp. 161-214.

W. S. DeForest, *Photoresist: Materials and processes*, McGraw-Hill Book Company, New York, N.Y. 1975, pp. 229-231.

Tanaka et al., Silicone Positive Resist. SPR-Structure and Resist Properties-, Preprint, p. 298, 29p-H-6, of 1985 Spring Symposium of Japan Society of Applied Physics (Japanese—No English).

H. Saeki, Journal of the electrochemical Society, vol. 134, No. 5, May 1987, pp. 1194-1199, Manchester, N.H., US.

Patent Abstracts of Japan, vol. 9, No. 62 (P-342) (1785), 19 Mar. 1985; & JP-A 59197036 (Nissan) 08.11.1984.

Patent Abstracts of Japan, vol. 10, No. 198 (P-476) (2254), 11 Jun. 1986; JP-A 6141142 (Kuraray) 27.02.1986.

Patent Abstracts of Japan, vol. 13, No. 236 (C-602(3584), 30 May 1989; & JP-A 143512 (Daikin) 15.02.1989.

*Primary Examiner*—Cynthia Hamilton
*Attorney, Agent, or Firm*—Armstrong & Kubovcik

[57] ABSTRACT

A high energy radiation-sensitive, pattern-forming resist composition comprising a polymer of the formula (I):

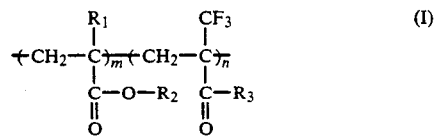

in which $R_1$ represents an alkyl groups, cyano group, —$CH_2OH$ or —$CH_2CO_2R$ wherein R represents an alkyl group, $R_2$ represents a hydrocarbon group containing at least one silicon atom, $R_3$ represents a group capable of causing crosslinking of the polymer upon application of heat, and m and n each is an integer. The resist composition is particularly useful as a top layer resist of the bi-level resist system, and the exposed top layer resist can be stably developed because of a remarkably increased difference of the solubility in the developer of the exposed and unexposed areas thereof.

13 Claims, 2 Drawing Sheets

RESIST COMPOSITION AND PATTERN FORMATION PROCESS

BACKGROUND OF THE INVENTION

1. Field of the Invention

The present invention relates to a resist composition, more particularly, it relates to a high energy radiation-sensitive, pattern-forming resist composition. This resist composition is particularly useful as a top layer resist in a bi-level resist system because, after a pattering exposure, the resist can be stably developed due to a remarkably increased difference of the solubility in the developer of the exposed and unexposed areas thereof. The present resist composition has an excellent resistance to oxygen reactive ion etching ($O_2$ RIE) The present invention also relates to a process for the formation of resist patterns using the resist composition of the present invention. The resist composition and pattern formation process of the present invention can be advantageously utilized in particular in the process of the formation of multilayer wiring during the production of semiconductor devices such as integrated circuits (ICs), large-scale integrated circuits (LSIs), and ultra-large-scale integrated circuits (ULSIs).

2. Description of the Related Art

A thin-film formation technology and photolithography or electron beam lithography are widely utilized in the production of electronic circuit devices with fine circuit patterns, for example, semiconductor devices, magnetic bubble memory devices and surface wave filter devices, and as an example thereof, the present description is of a production of wiring patterns. Namely, an electrically conductive layer, electrically insulating layer or other thin layer(s) are formed on a substrate by conventional physical methods such as vacuum deposition or sputtering, or conventional chemical methods such as chemical vapor deposition (CVD), and after the formation of such wiring layer, a resist is spin-coated to form a resist layer. The resist layer is then pattern-wise exposed to radiations such as ultraviolet (UV) radiations, and then developed to form resist patterns. Subsequent to the formation of resist patterns, the underlying wiring layer is wet-etched or dry-etched, using the resist patterns as a mask, and thus conductive fine patterns, insulating fine patterns or other fine patterns are formed on the substrate. Note, the term "substrate" used herein is intended to mean the substrate itself or the electrically conductive layer, electrically insulating layer or other thin layer(s) formed on the substrate.

Recently, to satisfy the requirements for a minimum pattern width of less than 1 μm in the resist patterns, an electron beam exposure is frequently used instead of a UV exposure to form resist patterns. Namely, after coating of an electron beam-sensitive resist, an electron beam having a reduced beam diameter is scanned over the resist to conduct a direct pattern-wise exposure. The EB-exposed resist is then developed with a suitable developer, and superior fine resist patterns are thus obtained. Note, a wavelength of the electron beam can vary depending upon the specific level of the applied voltage, but generally is about 0.1 Å.

Referring to the above-described formation of wiring patterns, this is generally carried out on a single-layer resist system, but this system is not suitable for the production of recently developed semiconductor devices because, in the process for the production of recent semiconductor devices such as very-large-scale integrated circuits (VLSIs) or ULSIs, to increase a degree of integration of the circuits, conventionally the wiring is constituted as multilayer wiring, and as a result, step portions having a height of 1 to 2 μm are formed on a surface of the substrate. This formation of the stepped portions is a bar to the obtaining of fine resist patterns with a high accuracy. Note, the single-layer resist system can not remove this bar.

To solve the problem due to the stepped portions on the substrate surface, a bi-level resist system was developed, and is now widely utilized in the production of VLSIs, ULSIs and other devices. Generally, the bi-level resist system is carried out as follows.

First, an organic resin which can be easily dry etched with oxygen ($O_2$) plasma, such as a phenolic novolak resin, is spin-coated at a layer thickness of about 2 μm on a substrate such as a semiconductor substrate, and baked to form a bottom layer resist, whereby an uneven surface of the substrate is levelled. Thereafter, a top layer resist is coated at a thickness of about 0.2 to 0.3 μm over the surface of the bottom layer resist to form a bi-level resist structure. Various polymeric materials can be used as the top layer resist. The positive-working EB resist used as the top layer resist can be dissolved in a developer as a result of a session of polymer chain upon the EB exposure, but the unexposed area of the top layer resist can retain the excellent resistance thereof to $O_2$ plasma, since the resist in this area is not exposed to EB.

After the formation of the bi-level resist structure, the top layer resist is pattern-wise exposed and developed to form a pattern of the top layer resist, and then, using this pattern as a mask, the underlying bottom layer resist is selectively etched with $O_2$ plasma. The pattern of the upper layer resist is transferred to the bottom layer resist.

In this bi-level resist system, since the bottom layer resist can prevent an undesirable influence of the steps of the underlying substrate on the patterning, and a reflection of exposing radiations by the substrate surface, and further, the top layer resist can be used at a reduced layer thickness, it becomes possible to remarkably increase the resolution of the resist in comparison with the single-layer resist system.

As a previously described, various polymers can be used as the top layer resist. Nevertheless, none thereof fully satisfies the requirements for the top layer resist to be exposed to high energy radiations such as electron beams and X-rays. For example, Tanaka et al teach in Preprint, 29p-H-6, of 1985 Spring Symposium of Japan Society of Applied Physics, that the polymer of the following formula (IV), i.e., a polymer of α-substituted acrylate containing a silicon atom in an ester moiety thereof, can be used as a positive-working resist having an excellent resistance to $O_2$ RIE (oxygen reactive ion etching):

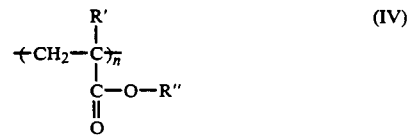

in which

R' represents a hydrocarbon group exclusive of hydrogen, a halogen atom or halogenated alkyl group, R" represents a silicon-containing alkyl group such as —CH$_2$Si(CH$_3$)$_3$, and n is an integer. It was found, however, that many of the resist polymers of the formula (IV) can be rapidly dissolved in an organic solvent (within several seconds), and therefore, they can not be stably developed after an exposure thereof.

To avoid this problem, Tanaka et al also teach in the same Preprint 29p-H-6 that methacrylic acid of the formula:

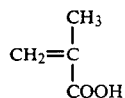

can be mixed with α-substituted acrylate of the formula:

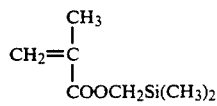

to form the polymer of the following formula (V):

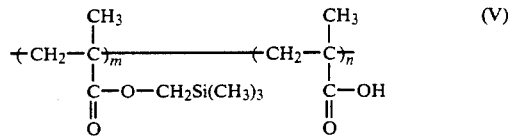

in which m and n each is an interger. After coating and before exposure, the resist polymer is heated or baked at an elevated temperature to cause a crosslinking thereof. Since the crosslinking can modify a solubility of the coated resist polymer in a developer, it become possible to conduct a more stable development than with the resist polymers of the formula (IV), i.e., to increase the types of solvents used as the developer. Nevertheless, the resist polymers of the formula (V) suffer from serious problems. Namely, since they have a low sensitivity and resolution, the resist polymers can not be used to exactly reproduce fine patterns. It is therefore desired to provide an improved resist polymer having a high sensitivity, resolution and resistance to O$_2$ RIE, and enabling a stable development.

SUMMARY OF THE INVENTION

In view of the above-described drawbacks of the prior art resist polymers or compositions, one object of the present invention is to provide a novel, high energy radiation-sensitive, pattern-forming resist composition which enables a stable development of the exposed resist coating, in addition to a high sensitivity to high energy radiations such as electron beams and X-rays, a high resolution, and a high resistance to dry etching including O$_2$ RIE. The resist composition is useful as a top layer resist in the bi-level resist system.

Another object of the present invention is to provide an improved process for the formation of resist patterns, which process enables the production of fine resist patterns on a substrate having topographic features or steps, i.e., concaves and convexes.

To attain these objects, the inventors studied many types of polymers, and found that, when the silicon-containing α-substituted acrylate monomer is copolymerized with the α-trifluoromethyl acrylate monomer, the resulting silicon-containing polymer acts as a resist exhibiting a high sensitivity and resolution, and can be stably developed after coating and exposure.

In one aspect thereof, the present invention resides in a high energy radiation-sensitive, pattern-forming resist composition which contains as a constitutional component thereof a polymer of the following general formula (I):

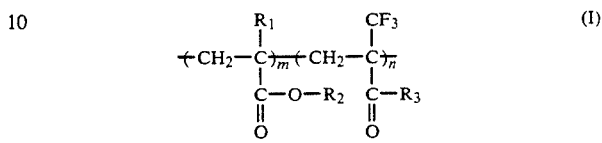

in which

R$_1$ represents a substituted or unsubstituted alkyl group, cyano group, —CH$_2$OH or —CH$_2$CO$_2$R wherein R represents a substituted or unsubstituted alkyl group, R$_2$ represents a hydrocarbon group containing at least one silicon atom, R$_3$ represents a group capable of causing a crosslinking of the polymer upon an application of heat, and m and n each is an interger.

In another aspect thereof, the present invention resides in a process for the formation of resist patterns, which comprises the steps of:

coating a resist comprising the polymer of the above-described formula (I), on a substrate;

previously baking the resulting resist at a temperature and time sufficient to cause a thermal crosslinking of the polymer;

selectively exposing the prebaked resist to high energy radiations to obtain a desired latent image pattern therein; and developing the pattern-wise exposed resist to selectively remove the exposed area of the resist.

Note, as previously mentioned, the substrate may include the substrate itself, such as a semiconductor substrate (for example, silicon or SOI, silicon-on-insulator) or any layer or coating formed on the substrate surface, such as an electrically conductive layer, electrically insulating layer or other thin layer(s) (for example, SiO$_2$ layer or aluminum layer), and high energy radiations used as an exposure source may include different radiation sources conventionally used in the field of lithography, such as electron beams (EB), X-rays, soft X-rays, ion beams, ultraviolet (UV) radiations or deep UV radiations.

The resist composition of the present invention is particularly useful as a top layer resist of the bi-level resist system, and the exposed top layer resist can be stably developed because of a remarkably increased difference of the solubility in the developer of the exposed and unexposed areas thereof. Of course, the resist composition can exhibit a high sensitivity, high resolution and high resistance to dry etching, and can reproduce fine patterns on the substrate with a high accuracy.

DESCRIPTION OF THE PREFERRED EMBODIMENTS

Figure 1A:
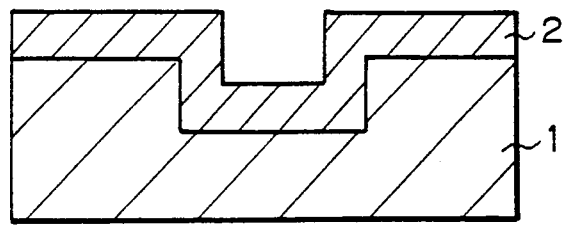
FIGS. 1A to 1H are cross-sectional views showing, in sequence, the resist process of the bi-level resist system according to the present invention.

As briefly mentioned in the previous paragraphs, the silicon-containing polymer used as a constitutional component of the resist composition according to the present invention can be produced by copolymerizing the silicon-containing α-substituted acrylate monomer with the α-trifluoromethyl acrylate monomer. More particularly, the copolymerization can be carried out by copolymerizing the silicon-containing α-substituted acrylate monomer of the general formula (II)

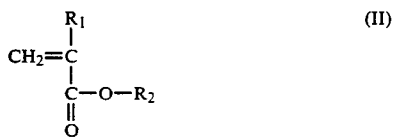

in which $R_1$ and $R_2$ are as defined above, with the α-trifluoromethyl acrylate monomer of the general formula (III):

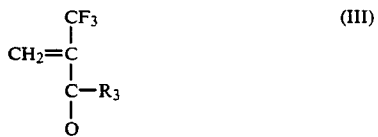

in which $R_3$ is as defined above.

The silicon-containing polymer used in the present invention preferably has a molecular weight of 5,000 to 1,000,000, and a silicon content of at least 9%.

The reasons why the silicon-containing polymer of the present invention can exhibit excellent resist properties have not been completely elucidated, but it is considered to be because a decomposition efficiency of the backbone of the polymer during an exposure to radiation is notably increased as a result of the introduction of an electron withdrawing trifluoromethyl ($CF_3$) group as an adduct to a carbon atom of the backbone of the polymer, and because a solubility of the unexposed area of the resist in the developer is modified as a result of the introduction of a thermal crosslinking-inducing group such as —OH, —OC(CH$_3$)$_3$, —NH$_2$ or —NHCH$_2$OH, to the polymer structure, and prebaking of the resist coating before the exposure step. It cannot be expected from the prior art references that, according to the present invention, a remarkably increased difference of the solubility in the developer of the exposed and unexposed areas of the resist can be attained, and therefore, the exposed resist can be stably developed. Namely, according to the present invention, the scope of the usable organic solvents used as the developer can be significantly expanded.

In the general formula (I) representing the silicon-containing polymer of the present invention, the substituent $R_1$ attached to a carbon atom of the polymer backbone is preferably —CH$_3$, —CF$_3$, —CN, —CH$_2$OH or —CH$_2$CO$_2$R wherein R is an alkyl group of 1 to 5 carbon atoms, $R_2$ is preferably CH$_2$Si(CH$_3$)$_3$, (CH$_2$)$_l$Si(CH$_3$)$_3$ (l=0-5), (CH$_2$)$_l$CH(CH$_3$).Si(CH$_3$)$_3$ (l=0-5), (CH$_2$)$_l$C(CH$_3$)$_2$Si(CH$_3$)$_3$(l=0-5), (CH$_2$)(C$_6$H$_5$))(CH$_3$)$_2$ (l=0-3), (CH$_2$)$_l$Si(C$_6$H$_5$)CH$_3$ (l=0-3), (CH$_2$)$_l$Si(C$_6$H$_5$)$_3$ Si(C$_6$H$_5$)$_{(l=0-3)}$ or (CH$_2$)$_l$Si(CH$_3$)$_2$Si(CH$_3$)$_3$(l=0-3), and $R_3$ is preferably —OH, —OC(CH$_3$)$_3$—NH$_2$, or —NHCHH$_2$OH.

The resist composition according to the present invention is positive-working, and can be advantageously used in both the single-layer resist system and bi-level resist system. More preferably, the resist composition can be used as a top layer resist in the bi-level resist system.

The bi-level resist system-based pattern formation process according to the present invention can be carried out, for example, in the manner outlined in the accompanying drawings: FIGS. 1A to 1H.

FIG. 1A is a cross-sectional view of the substrate before coating with a resist. The substrate comprises a semiconductor 1 with steps and an overcoat layer 2, formed on the substrate 1, to be processed or fabricated. In the illustrated example, the substrate 1 is a silicon, and the overcoat layer 2 is silicon dioxide (SiO$_2$) produced by a wet oxidation of the silicon substrate 1. It is intended to open windows 5 in the SiO$_2$ layer 2 as shown in FIG. 1H.

Figure 1B:
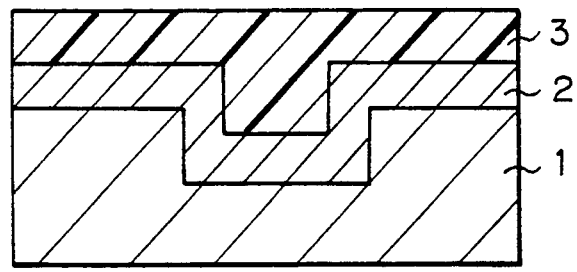

First, as shown in FIG. 1B, to level the steps of the substrate, an organic resin such as a phenolic novolak resin (for example, "OFPR" commercially available from Tokyo Ohka Industries Co., Ltd. or "MP-1300" commercially available from Shipley & Co.) is coated at a layer thickness of about 1 to 3 μm onto the SiO$_2$ layer 2 to form a bottom layer resist (or "levelling layer") 3.

Figure 1C:
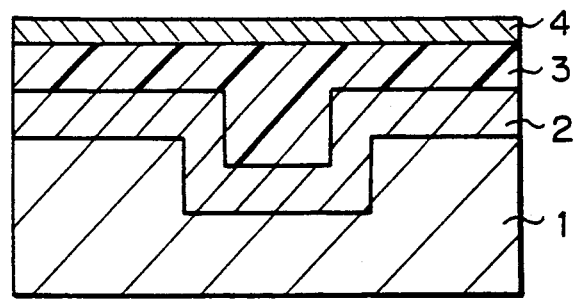

After the levelling of an uneven surface of the substrate, the resist composition of the present invention is applied to the surface of the previously formed bottom layer resist 3 to form a top layer resist 4 (see, FIG. 1C). Preferably, the resist composition is applied from a solution thereof in organic solvents such as alcohols, ketones and ethers onto the substrate surface, and a layer thickness of the thus formed top layer resist is preferably about 0.1 to 0.5 μm. As illustrated in FIG. 1C, a bi-level resist structure consisting of the bottom layer resist 3 and top layer resist 4 is thus obtained.

After the formation of the bi-level resist structure and before the pattern-wise exposure of the top layer resist, the substrate is prebaked at an elevated temperature (for example, at 240° C. for 5 minutes) to cause the thermal crosslinking of the silicon-containing polymer of the top layer resist (not shown). The mechanism of this prebaking was described in the above paragraphs.

Figure 1D:
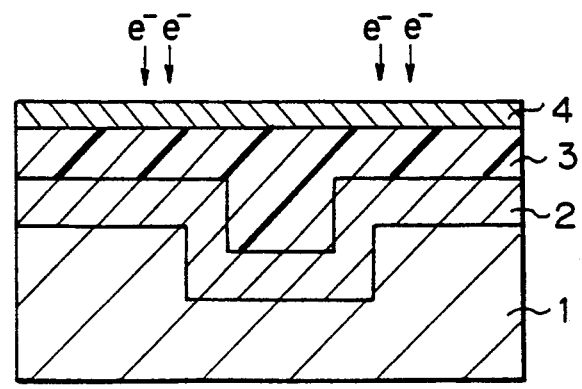

After prebaking, as illustrated in FIG. 1D, the top layer resist 4 is pattern-wise exposed to exposure radiations (e$^-$). The exposure radiations used herein are electron beams. The exposed area of the top layer resist 4 is solubilized, since it is positive-working.

Figure 1E:
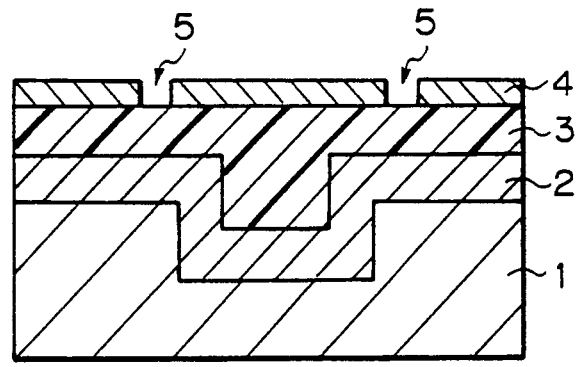

The pattern-wise exposed top layer resist is developed by immersing the substrate in a liquid developer capable of selectively dissolving the resist in the exposed area thereof. As illustrated in FIG. 1E, a pattern of the top layer resist 4 is formed over the bottom layer resist 3. The patterned top layer resist 4 contains small windows 5 in the exposed areas thereof.

Figure 1F:
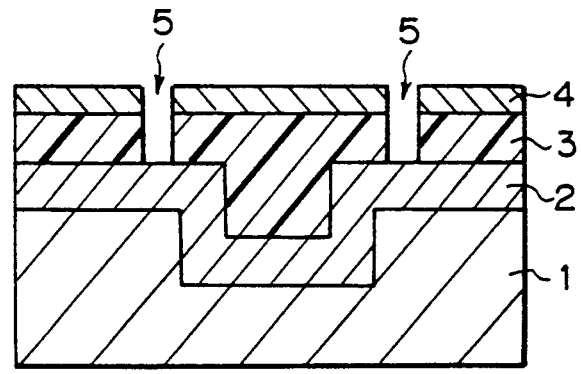

After the patterning of the top layer resist, using the pattern of this resist as a mask, the underlying bottom layer resist is selectively etched with an etching source such as oxygen plasma (O$_2$ RIE). As a result, as shown in FIG. 1F, the pattern of the upper layer resist 4 is transferred to the bottom layer resist.

In the above-described bi-level resist system, since the bottom layer resist can prevent an undesirable influence of the steps of the underlying substrate on the patterning, and a reflection of exposing radiations by the substrate surface, and further, the top layer resist can be used at a reduced layer thickness, it becomes possible to remarkably increase the resolution of the resist in comparison with the single-layer resist system.

Figure 1G:
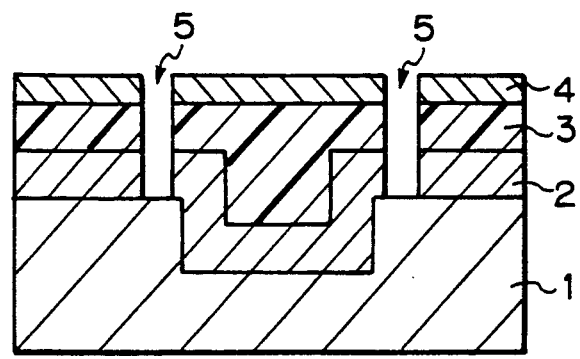
Figure 1H:
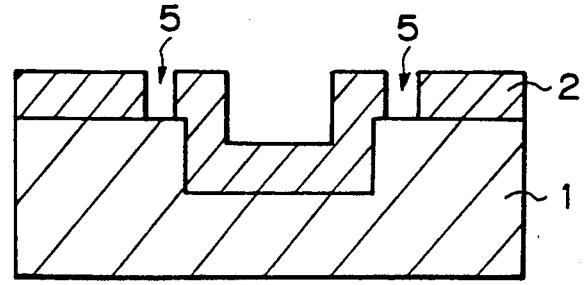

Subsequent to the patterning of the bi-level resist structure, the substrate, i.e., $SiO_2$ layer 2 is selectively etched through the mask of the patterned resist 3 and 4 as shown in FIG. 1G. The etching of the $SiO_2$ layer can be carried out in accordance with any conventional method, but preferably this etching is carried out by using a wet etching (for example, $HF+H_2O$) or dry etching (for example, RIE from $CHF_3$)

After etching, the resist used as the mask in the etching step is removed by a suitable solution, or other means, and thus, as shown in FIG. 1H, the patterned $SiO_2$ layer 2 is obtained on the silicon substrate 1.

Although not described herein in detail, the pattern formation process of the present invention can be advantageously utilized in the production of semiconductor devices such as LSIs, VLSIs and ULSIs, and other devices.

The present invention will be further described with reference to working examples thereof. Note, in these examples, the use of electron beams (EB) as an exposure source is described, but similar results can be obtained when X-rays are used instead of EB.

EXAMPLE 1

Synthesis of Polymer No. 1

A same amount (molar ratio) of trimethyl silylmethyl methacrylate of the formula:

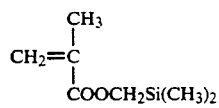

and α-trifluoroacrylic acid of the formula:

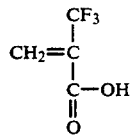

were mixed, and admixed with 0.05% by mole of azobisisobutylonitril. The mixture was held at 80° C. for 12 hours, and the thus-obtained polymer product (hereinafter, Polymer No. 1) was confirmed to be represented by the structural formula:

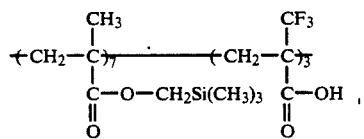

and to have a weight average molecular weight of $5.6 \times 10^5$.

EXAMPLE 2

Synthesis of Polymer No. 2

A same amount (molar ratio) of trimethyl silylmethyl-methacrylate of the formula:

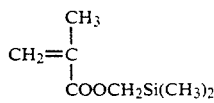

and t-butyl-2-trifluoromethyl acrylate of the formula:

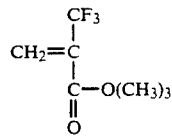

were mixed, and copolymerized in the manner described in Example 1. The thus obtained polymer product hereinafter, Polymer No. 2) was confirmed to be represented by the structural formula:

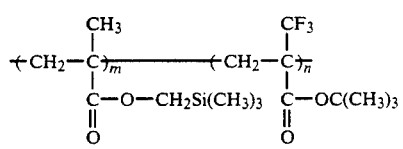

and to have a weight average molecular weight of $3.4 \times 10^5$.

EXAMPLE 3

Formation of Single-layer Resist Pattern

The Polymer No. 1 obtained in Example 1 was dissolved in methylisobutylketone (MIBK) to prepare a 60 g/l MIBK solution thereof, and the MIBK resist solution was spin-coated at a layer thickness of about 2700 Å on a silicon wafer.

The coated resist was prebaked for 5 minutes on a hot plate at 240° C., and the prebaked resist was EB-scanned at an acceleration voltage of 20 KeV. After the EB exposure, the resist was developed with isopropyl alcohol (IPA) for 30 seconds, and a satisfactory resist pattern having no loss of the thickness in the unexposed area of the resist was obtained at a sensitivity of 14.4 $\mu C/cm^2$.

COMPARATIVE EXAMPLE 1

Formation of Single-layer Resist Pattern

The resist solution containing polytrimethylsilylmethyl methacrylate of the formula:

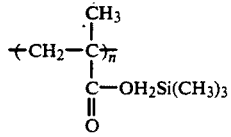

was spin-coated at a layer thickness of about 2700 Å on a silicon wafer.

The coated resist was EB-scanned at an acceleration voltage of 20 KeV, and then developed with a mixture (20:3) of IPA and $H_2O$ for 10 minutes.

A satisfactory resist pattern was not obtained. Namely, it was found that the sensitivity was 102.4 $\mu C/cm^2$, and the unexposed area of the resist had a loss of the thickness of about 500 Å. In addition, a 3 $\mu m$ line and space resolution could not be obtained.

An extended developing time did not improve the above sensitivity. Further, the use of the mixture (20:1) of IPA and H₂O as the developer caused a rapid and overall dissolving of the resist (within several minutes). Namely, a resist pattern was not obtained.

COMPARATIVE EXAMPLE 2

Formation of Single-layer Resist Pattern

The resist solution containing the copolymer of trimethylsilylmethyl methacrylate with methacrylic acid represented by the formula:

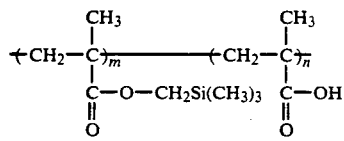

was spin-coated at a layer thickness of about 2700 Å a silicon wafer.

The coated resist was prebaked for 8 minutes on a hot plate at 200° C., and the prebaked resist was EB-scanned at an acceleration voltage of 20 KeV. After the EB exposure, the resist was developed with a mixture (5:1) of IPA and H₂O for 2 minutes, but a satisfactory resist pattern was not obtained. Sensitivity: 144.0 $\mu$C/cm² (bad).

EXAMPLE 4

Formation of Single-layer Resist Pattern

The Polymer No. 2 obtained in Example 2 was dissolved in methylisobutylketone (MIBK) to prepare a 60 g/l MIBK solution thereof. The MIBK resist solution was spin-coated at a layer thickness of about 2700 Å on a silicon wafer.

The coated resist was prebaked for 4 minutes on a hot plate at 240° C., and the prebaked resist was EB-scanned at an acceleration voltage of 20 KeV. After the EB exposure, the resist was developed with isopropyl alcohol (IPA) for 30 seconds, and a satisfactory resist pattern having no loss of the thickness in the unexposed area of the resist was obtained at a sensitivity of 14.4 $\mu$C/cm².

EXAMPLE 5

Formation of Bi-level Resist Pattern

A phenolic novolak resin resist ("OFPR", Tokyo Ohka) was spin-coated at a layer thickness of 2.0 $\mu$m on a silicon wafer, and baked for 1 hour in an oven at 200° C. to obtain a bottom layer resist. Next, the MIBK resist solution (same as those prepared in Example 3 was spin-coated at a layer thickness of about 3000 Å on the bottom layer resist to obtain a bi-level resist. The thus-obtained bi-level resist was prebaked for 5 minutes on a hot plate at 240° C., and then EB-scanned at an acceleration voltage of 20 KeV. The resist was developed with isopropyl alcohol (IPA) for 30 seconds, and then postbaked for 20 minutes in an oven at 100° C. The wafer was placed in a parallel plates dry etching system, and dry-etched with O₂ plasma (power: 300 W, pressure: 0.03 Torr, and O₂ flow rate: 100 sccm) for 4 minutes. Fine patterns (0.4 $\mu$m line and space) of the top layer resist were exactly transferred to the bottom layer resist.

We claim:

1. A process for the formation of resist patterns, which comprises the steps of:
    coating a resist comprising a polymer of the following general formula (I):

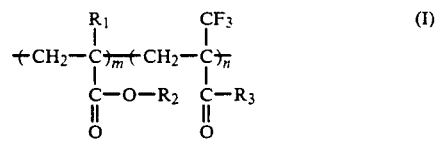

in which
R₁ represents a substituted or unsubstituted alkyl group, or cyano group,
R₂ represents a hydrocarbon group containing at least one silicon atom,
R₃ represents a group capable of causing crosslinking of the polymer upon application of heat, and
m and n each is an integer, onto a substrate;
baking the resist at a temperature and time sufficient to cause a thermal crosslinking of the polymer;
selectively exposing the resist to high energy radiations to obtain a desired latent image pattern therein; and
developing the pattern-wise exposed resist to selectively remove the exposed area of the resist.

2. A process according to claim 1, in which the polymer is a copolymerization product of a silicon-containing α-substituted acrylate of the general formula (II)

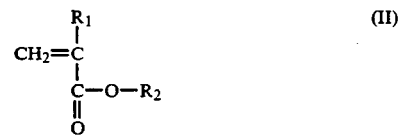

and a α-trifluoromethyl acrylate of the general formula (III):

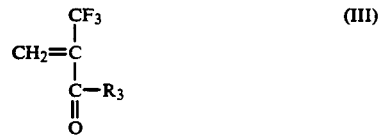

3. A process according to claim 2, in which R₁ of the general formula (I) represents —CH₂OH or —CH₂CO₂R wherein R represent a substituted or unsubstituted alkyl group.

4. A process according to claim 1, in which R₁ of the general formula (I) is —CH₃, —CF₃, —CN, —CH₂OH or —CH₂CO₂R wherein R is an alkyl group of 1 to 5 carbon atoms, R₂ is, (CH₂)$_l$Si(CH₃)₃ (l=0–5), (CH₂)$_l$CH(CH₃).Si(CH₃)₃ (l=0–5), (CH₂)$_l$C(CH₃)₂Si(CH₃)₃ (l=0–5), (CH₂)$_l$Si(C₆H₅)(CH₃)₂ (l=0–3), (CH₂)$_l$Si(C₆H₅)CH₃ (l=0–3), (CH₂)$_l$Si(C₆H₅)₃ (l=0–3) or (CH₂)$_l$Si(CH₃)₂Si(CH₃)₃ (l=0–3), and R₃ is —OH, —OC(CH₃)₃, —NH₂, or —NHCH₂OH.

5. A process according to claim 4, in which R₂ is CH₂Si(CH₃)₃.

6. A process according to claim 1, in which the resist is applied from a solution thereof in an organic solvent onto the substrate surface.

7. A process according to claim 1, in which the prebaked resist is exposed to a pattern of electron beams, X-rays, soft X-rays, ion beams, ultraviolet radiations or deep ultraviolet radiations.

8. A process according to claim 1, in which developing is conducted with a liquid developer capable of selectively dissolving the exposed area of the resist.

9. A process according to claim 1, in which, when the substrate has stepped portions on a surface thereof, a bottom layer resist consisting of a resist material capable of leveling an uneven surfaced of the stepped substrate and a top layer resist containing the polymer of the general formula (I) are applied, in sequence, onto the substrate surface to form a bi-level resist coating, the top layer resist is exposed to a pattern of high energy radiations, the pattern-wise exposed top layer resist is developed to selectively remove an exposed area thereof, and the resulting pattern of the top layer resist is transferred to the underlying bottom layer resist.

10. A process according to claim 9, in which the resist material constituting the bottom layer resist is a phenolic novolak resin or cresol novolak resin.

11. A process according to claim 9, in which the pattern of the top layer resist is transferred to the bottom layer resist by oxygen-reactive ion etching.

12. A process according to claim 9, in which the resulting resist patterns are used as a mask, when the underlying substrate is intended to be selectively etched off.

13. A process according to claim 1, in which $R_1$ of the general formula (I) represents —$CH_2OH$ or —$CH_2CO_2R$ wherein R represent a substituted or unsubstitued alkyl group.

* * * * *